(12) United States Patent
Tanaka et al.

(10) Patent No.: US 8,009,391 B2
(45) Date of Patent: Aug. 30, 2011

(54) MAGNETIC SENSING ELEMENT AND METHOD FOR MANUFACTURING THE SAME

(75) Inventors: Kenichi Tanaka, Tokyo (JP); Eiji Umetsu, Tokyo (JP); Kazuaki Ikarashi, Tokyo (JP); Kota Asatsuma, Tokyo (JP); Norimasa Okanishi, Tokyo (JP); Yoshihiro Nishiyama, Tokyo (JP); Masamichi Saito, Tokyo (JP); Yosuke Ide, Tokyo (JP); Kazumasa Nishimura, Tokyo (JP); Ryo Nakabayashi, Tokyo (JP); Hidekazu Kobayashi, Tokyo (JP); Akio Hanada, Tokyo (JP); Naoya Hasegawa, Tokyo (JP)

(73) Assignee: TDK Corporation, Tokyo (JP)

( * ) Notice: Subject to any disclaimer, the term of this patent is extended or adjusted under 35 U.S.C. 154(b) by 753 days.

(21) Appl. No.: 12/120,887

(22) Filed: May 15, 2008

(65) Prior Publication Data
US 2008/0285180 A1    Nov. 20, 2008

(30) Foreign Application Priority Data

May 15, 2007 (JP) ................................. 2007-128827

(51) Int. Cl.
*G11B 5/33* (2006.01)
(52) U.S. Cl. ........................................ 360/319
(58) Field of Classification Search .................. 360/319, 360/245.3, 316, 314, 324.12, 317, 324.1, 360/313; 29/603.18, 603.14, 603.01, 603.04
See application file for complete search history.

(56) References Cited

U.S. PATENT DOCUMENTS

| 7,916,436 B2 * | 3/2011 | Ishizone et al. ............ 360/324.2 |
| 2008/0291586 A1 * | 11/2008 | Ishizone et al. .......... 360/324.11 |

FOREIGN PATENT DOCUMENTS

| JP | 2001-28108 | 1/2001 |
| JP | 2001-52316 | 2/2001 |
| JP | 2001-176027 | 6/2001 |

* cited by examiner

*Primary Examiner* — Allen T Cao
(74) *Attorney, Agent, or Firm* — Brinks Hofer Gilson & Lione

(57) ABSTRACT

An underlying layer is composed of Co—Fe—B that is an amorphous magnetic material. Thus, the upper surface of the underlying layer can be taken as a lower shield layer-side reference position for obtaining a gap length (GL) between upper and lower shields, resulting in a narrower gap than before. In addition, since the underlying layer has an amorphous structure, the underlying layer does not adversely affect the crystalline orientation of individual layers to be formed thereon, and the surface of the underlying layer has good planarizability. Accordingly, PW50 (half-amplitude pulse width) and SN ratio can be improved more than before without causing a decrease in rate of change in resistance (Δ R/R) or the like, thereby achieving a structure suitable for increasing recording density.

21 Claims, 13 Drawing Sheets

MAGNETIC SENSING ELEMENT AND METHOD FOR MANUFACTURING THE SAME

CLAIM OF PRIORITY

This application claims benefit of the Japanese Patent Application No. 2007-128827 filed on May 15, 2007, the entire content of which is hereby incorporated by reference.

BACKGROUND

1. Field of the Invention

Particularly, the present invention relates to a magnetic sensing element in which PW50 (half-amplitude pulse width) and SN ratio (Signal to Noise Ratio) are improved more than before without causing a decrease in reproducing characteristics such as rate of change in resistance ($\Delta$ R/R) and which is thus suitable for increasing recording density, and a method for manufacturing the same.

2. Description of the Related Art

Typically, tunneling magnetoresistive elements have such a structure that a multilayered film, which makes use of a tunneling magnetoresistance effect, is interposed between lower and upper shied layers that are opposed to each other in a film thickness direction.

More specifically, the multilayered film is formed by depositing, for example, an underlying layer, an antiferromagnetic layer, a pinned magnetic layer, an insulating barrier layer, a free magnetic layer, and a protective layer on the lower shied layer in the that order from the bottom.

In the prior art, generally, the underlying layer has been composed of Ta, which is a nonmagnetic material. For example, Patent Document 1 discloses in the paragraph [0056] a case where Ta is used as an underlying layer.

Patent Document 1:
Japanese Unexamined Patent Application Publication No 2001-176027
Patent Document 2:
Japanese Unexamined Patent Application Publication No 2001-52316
Patent Document 3:
Japanese Unexamined Patent Application Publication No 2001-28108

In order to increase recording density, it is necessary to be able to accurately read data recorded at small bit intervals, and for this purpose, it is important to decrease a half-amplitude pulse width (PW50).

In order to decrease the half-amplitude pulse width (PW50), it is effective to decrease a gap length (GL) obtained from a distance between upper and lower shield layers. In tunneling magnetic sensing elements having a conventional configuration, the gap length between the upper and lower shields corresponds to a film thickness of a multilayered film interposed between the upper and lower shields.

Thus, the gap length can be decreased by simply reducing the film thickness of the multilayered film, but individual layers of the multilayered film already have a film thickness as thin as a few tens of A. Therefore, it is desirable to realize a narrow gap with a minimum change in film thickness of the individual layers.

When narrowing the gap, moreover, it has to be avoided to cause deterioration of reproducing characteristics such as rate of change in resistance ($\Delta$ R/R).

In short, it has been desired to decrease the half-amplitude pulse width (PW50) by narrowing the gap while avoiding a decrease in the rate of change in resistance ($\Delta$ R/R). In the prior art, however, no improvement has been made, particularly, on the underlying layer, which is to be disposed in contact with the lower shield layer, so as to facilitate narrowing the gap without deteriorating reproducing characteristics.

SUMMARY

The present invention is to solve the problems of the prior art and more particularly has an object to provide a magnetic sensing element in which PW50 (half-amplitude pulse width) and SN ratio (Signal to Noise Ratio) are improved more than before through an improvement in an underlying layer without causing a decrease in reproducing characteristics such as rate of change in resistance ($\Delta$ R/R) and which is thus suitable for increasing recording density.

According to one aspect of the present invention, there is provided a magnetic sensing element comprising a multilayered film with a plurality of layers stacked between opposing lower and upper shield layers that are spaced apart from each other in a film thickness direction, wherein a maximum width of the multilayered film in a track width direction is smaller than a width of either of the lower and upper shield layers in the track width direction, and at both sides of the multilayered film in the track width direction, a bias layer and an insulating layer constitute a laminated structure filling a space between the lower and upper shield layers, wherein a bottom layer of the multilayered film is an underlying layer disposed on and in contact with the lower shield layer, a top layer of the multilayered film is a protective layer, the multilayered film further includes at least a pinned magnetic layer, a free magnetic layer, and a nonmagnetic material layer deposited between the underlying layer and the protective layer in the film thickness direction, and the nonmagnetic material layer is disposed between the pinned magnetic layer and the free magnetic layer, wherein the underlying layer is composed of an amorphous magnetic material.

In the present invention, as described above, since the underlying layer disposed on and in contact with the lower shield layer is a magnetic layer, unlike the prior art using a nonmagnetic material such as Ta for the underlying layer, the upper surface of the underlying layer can be taken as a lower shield layer-side reference position for calculating a gap length (GL) between the upper and lower shields, resulting in a narrower gap than before. In the experiment described hereinafter, actually, it has been proved that the above configuration can decrease PW50 (half-amplitude pulse width) as compared with conventional ones in which the underlying layer is composed of Ta.

In the present invention, moreover, since the underlying layer has an amorphous structure, the underlying layer does not adversely affect the crystalline orientation of individual layers to be formed thereon, and in addition, the surface of the underlying layer has good planarizability. Thus, the rate of change in resistance ($\Delta$ R/R) can be maintained at the same level as before.

As described above, the present invention provides the magnetic sensing element with a structure which improves PW50 (half-amplitude pulse width) and SN ratio more than before while avoiding a decrease in reproducing characteristics such as rate of change in resistance ($\Delta$ R/R) and is thus suitable for increasing recording density.

In the present invention, the underlying layer is preferably composed of Co—X, Co—Fe—X (wherein X is one or more elements selected from the group consisting of B, Nb, Al, Si, Ti, V, Mn, Cu, Zr, Ta, and Hf), or Ni—Fe—Y (wherein Y is one or more elements selected from the group consisting of B, Nb, Al, Si, Ti, V, Mn, Cu, Zr, Ta, and Hf).

Among them, the underlying layer is preferably composed of a magnetic material whose composition formula is $\{Co_aFe_{100-a}\}_{100-b}X_b$ (wherein an atomic ratio "a" is from 25 to 100, and a concentration "b" of an element X is from 10 to 50 at %). More preferably, the concentration "b" is from 10 to 40 at %.

Using the above materials for the underlying layer, the underlying layer can be formed appropriately as an amorphous magnetic layer, thus providing the surface of the underlying layer with good planarizability.

In the present invention, preferably, the underlying layer has an average film thickness of 10 to 100 Å. More preferably, the underlying layer has an average film thickness of 10 to 50 Å. This provides the underlying layer with good soft magnetic properties without impairing the function as an underlying layer. Thus, PW50 (half-amplitude pulse width) and SN ratio can be improved more effectively while maintaining the rate of change in resistance ($\Delta$ R/R) at the same level as before.

In the present invention, the lower shield layer is preferably composed of a magnetic material having better soft magnetic properties than the underlying layer has. For example, it is preferred that the lower shield layer is composed of NiFe. This makes it possible to effectively improve the shielding effect.

Also in the present invention, the nonmagnetic material layer is preferably an insulating barrier layer. The insulating barrier layer is preferably composed of Al—O or Mg—O. Also in the experiment described hereinafter, when the insulating barrier layer was composed of Al—O or Mg—O, good experimental results were obtained with respect to the rate of change in resistance ($\Delta$ R/R) and PW50.

Also in the present invention, the multilayered film is preferably formed by depositing the underlying layer, a seed layer, an antiferromagnetic layer, the pinned magnetic layer, the nonmagnetic material layer, the free magnetic layer, and the protective layer in the named order. With this configuration, a high rate of change in resistance ($\Delta$ R/R) can be obtained stably.

According to another aspect of the present invention, there is provided a method for manufacturing a magnetic sensing element comprising:

forming a lower shield layer;

forming a multilayered film on the lower shield layer, the multilayered film having a plurality of layers deposited continuously in a same vacuum, a bottom layer of the multilayered film being an underlying layer composed of an amorphous magnetic material and disposed on and in contact with the lower shield layer, a top layer of the multilayered film being a protective layer, the multilayered film further including at least a pinned magnetic layer, a free magnetic layer, and a nonmagnetic material layer deposited between the underlying layer and the protective layer in a film thickness direction, the nonmagnetic material layer being disposed between the pinned magnetic layer and the free magnetic layer;

removing both side portions of the multilayered film in a track width direction so that a maximum width of the multilayered film in the track width direction is smaller than a width of the lower shield layer in the track width direction;

forming a laminated structure including a bias layer and an insulating layer to fill a space created by removing the both side portions of the multilayered film; and forming an upper shield layer over the multilayered film and the laminated structure at both sides of the multilayered film, the upper shield layer having a larger width than the multilayered film in the track width direction.

In the present invention, at the step (b), the individual layers of the multilayered film are deposited continuously in the same vacuum, wherein the underlying layer composed of an amorphous magnetic material is disposed on and in contact with the lower shied layer as a bottom layer of the multilayered film. With such continuous deposition of the individual layers of the multilayered film and formation of the amorphous underlying layer on the lower shield layer, the crystalline orientation of the individual layers can be properly controlled while preventing the surfaces of the individual layers from being exposed to an outside air. In addition, this inhibits the effect of the crystalline orientation of the lower shield layer on the individual layers overlying the underlying layer, prevents the underlying layer itself from adversely affecting the crystalline orientation of the individual layers, and improves the planarizability of the surface of the underlying layer.

Since the underlying layer is a magnetic layer, moreover, the upper surface of the underlying layer can be taken as a lower shield layer-side reference position for calculating a gap length (GL) between the upper and lower shield layers, resulting in a narrower gap than before.

As described above, a magnetic sensing element in which PW50 (half-amplitude pulse width) and SN ratio are improved more than before without causing a decrease in reproducing characteristics such as rate of change in resistance ($\Delta$ R/R) and which is thus suitable for increasing recording density can be manufactured easily and appropriately.

In the present invention, the underlying layer is preferably composed of Co—X, Co—Fe—X (wherein X is one or more elements selected from the group consisting of B, Nb, Al, Si, Ti, V, Mn, Cu, Zr, Ta, and Hf), or Ni—Fe—Y (wherein Y is one or more elements selected from the group consisting of B, Nb, Al, Si, Ti, V, Mn, Cu, Zr, Ta, and Hf).

Particularly in the present invention, the underlying layer is preferably composed of a magnetic material whose composition formula is $\{Co_aFe_{100-a}\}_{100-b}X_b$ (wherein an atomic ratio "a" is from 25 to 100, and a concentration "b" of an element X is from 10 to 50 at %). In this case, more preferably, the concentration "b" is from 10 to 40 at %.

Using the above materials for the underlying layer, the underlying layer can be formed appropriately as an amorphous magnetic layer, thus providing the surface of the underlying layer with good planarizability.

Also in the present invention, preferably, the underlying layer has a film thickness of 10 to 100 Å. More preferably, the underlying layer has a film thickness of 10 to 50 Å. This provides the underlying layer with good soft magnetic properties without impairing the function as an underlying layer.

Also in the present invention, the lower shield layer is preferably composed of a magnetic material having better soft magnetic properties than the underlying layer has. More preferably, the lower shield layer is composed of Ni—Fe.

Also in the present invention, the nonmagnetic material layer is preferably an insulating barrier layer composed of Al—O or Mg—O.

Also in the present invention, the multilayered film is preferably formed by depositing the underlying layer, a seed layer, an antiferromagnetic layer, the pinned magnetic layer, the nonmagnetic material layer, the free magnetic layer, and the protective layer in the named order.

When the underlying layer is composed of an amorphous magnetic layer, as in the present invention, determining the materials and deposition order as above results in effectively improving PW50 (half-amplitude pulse width) and SN ratio more than before while avoiding a decrease in reproducing characteristics such as rate of change in resistance (Δ R/R), and thus a magnetic sensing element suitable for increasing recording density can be manufactured easily and appropriately.

As described above, the present invention provides the magnetic sensing element with a structure which improves PW50 (half-amplitude pulse width) and SN ratio more than before while avoiding a decrease in reproducing characteristics such as rate of change in resistance (Δ R/R) and is thus suitable for increasing recording density.

The present invention will be more fully understood from the detailed description given hereinbelow and the accompanying drawings which are given by way of illustration only, and thus are not to be considered as limiting the present invention.

DESCRIPTION OF THE PREFERRED EMBODIMENTS

Figure 1:
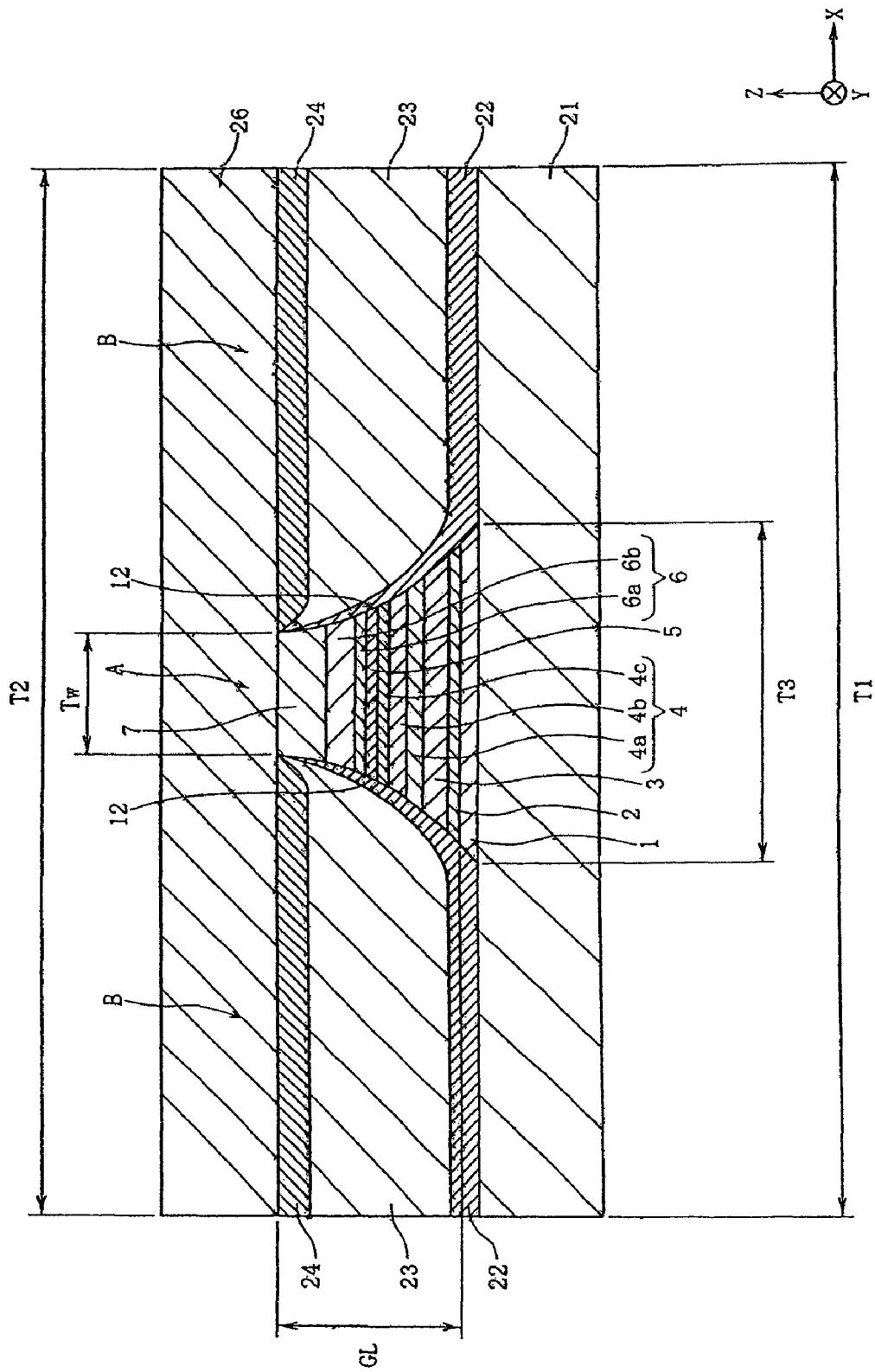
FIG. 1 is a cross-sectional view of a tunneling magnetic sensing element according to one embodiment of the present invention, taken along a plane parallel to a surface facing a recoding medium.

FIG. 1 is a cross-sectional view of a tunneling magnetic sensing element according to one embodiment of the present invention, taken along a plane parallel to a surface facing a recoding medium.

The tunneling magnetic sensing element is mounted on a trailing end of a floating-type slider provided on a hard disk drive to detect a leakage magnetic field (recorded magnetic field) from a magnetic recording medium. In the drawings, the X direction corresponds to the track width direction, the Y direction corresponds to the direction of a leakage magnetic field from a magnetic recording medium (height direction), and the Z direction corresponds to the traveling direction of the magnetic recording medium and the lamination direction of the individual layers in the tunneling magnetic sensing element.

Referring to FIG. 1, a lower shield layer 21, for example, composed of Ni—Fe, is disposed at the bottom. A multilayered film A is disposed on the lower shield layer 21. Side portions B disposed at both sides of the multilayered film A in the track width direction (X direction in the figure) are each composed of a lower insulating layer 22, a hard bias layer 23, and an upper insulating layer 24.

The bottom layer in the multilayered film A is an underlying layer 1 composed of an amorphous magnetic material. The underlying layer 1 is disposed on and in contact with the lower shield layer 21.

A seed layer 2 is disposed on the underlying layer 1. The seed layer 2 is, for example, composed of Ru.

An antiferromagnetic layer 3 disposed on the seed layer 2 is preferably composed of an antiferromagnetic material containing Mn and an element Z (wherein Z is one or two or more elements selected from the group consisting of Pt, Pd, Ir, Rh, Ru, and Os).

Alternatively, the antiferromagnetic layer 3 may be composed of an antiferromagnetic material containing Mn, the element Z, and an element Z' (wherein the element Z' is one or two or more elements selected from the group consisting of Ne, Ar, Kr, Xe, Be, B, C, N, Mg, Al, Si, P, Ti, V, Cr, Fe, Co, Ni, Cu, Zn, Ga, Ge, Zr, Nb, Mo, Ag, Cd, Sn, Hf, Ta, W, Re, Au, Pb and rare-earth elements).

The antiferromagnetic layer 3 is, for example, composed of IrMn.

A pinned magnetic layer 4 is disposed on the antiferromagnetic layer 3. The pinned magnetic layer 4 has a synthetic ferrimagnetic structure in which a first pinned magnetic sublayer 4a, a nonmagnetic intermediate sublayer 4b, and a second pinned magnetic sublayer 4c are disposed in that order from the bottom. The magnetizations of the first pinned magnetic sublayer 4a and the second pinned magnetic sublayer 4c are directed antiparallel by an exchange coupling magnetic field at the interface between the antiferromagnetic layer 3 and the first pinned magnetic sublayer 4a and by a coupling magnetic field due to RKKY interaction between the first pinned magnetic sublayer 4a and the second pinned magnetic sublayer 4c through the nonmagnetic intermediate sublayer 4b. With this synthetic ferrimagnetic structure of the pinned magnetic layer 4, the magnetization of the pinned magnetic layer 4 can be stabilized. In addition, the apparent exchange coupling magnetic field generated at the interface between the pinned magnetic layer 4 and the antiferromagnetic layer 3 can be increased. For example, each of the first pinned magnetic sublayer 4a and the second pinned magnetic sublayer 4c has a thickness of about 12 to 40 Å, and the nonmagnetic intermediate sublayer 4b has a thickness of about 8 to 10 Å.

The first pinned magnetic sublayer 4a is, for example, composed of Co—Fe. The second pinned magnetic sublayer 4c is, for example, composed of Co—Fe—B. In this case, the second pinned magnetic sublayer 4c may have a composition formula of $\{Co_\alpha Fe_{100-\alpha}\}_{100-\beta}B_\beta$, wherein the atomic ratio α is from 25 to 100, and the concentration β of B is from 10 to 40 at %. The nonmagnetic intermediate sublayer 4b is composed of a nonmagnetic conductive material, such as Ru, Rh, Ir, Cr, Re, or Cu.

An insulating barrier layer 5 disposed on the pinned magnetic layer 4 is, for example, composed of aluminum oxide (Al—O) or magnesium oxide (Mg—O).

A free magnetic layer 6 is disposed on the insulating barrier layer 5. The free magnetic layer 6 has a layered structure including an enhancement layer 6a composed of, for example, Co—Fe and a soft magnetic layer 6b disposed on the enhancement layer 6a and composed of, for example, Ni—Fe.

The width of the free magnetic layer 6 in the track width direction (X direction in the figure) defines the track width Tw.

A protective layer 7 composed of, for example, Ta is disposed on the free magnetic layer 6.

Both side faces 12, 12 of the multilayered film A in the track width direction (X direction in the figure) are formed as inclined surfaces such that the width in the track width direction gradually decreases upward.

As shown in FIG. 1, a lower insulating layer 22 extends from the lower shield layer 21 at each side of the multilayered film A to each side face 12 of the multilayered film A. A hard bias layer 23 is disposed on the lower insulating layer 22, and an upper insulating layer 24 is disposed on the hard bias layer 23.

A bias underlying layer (not shown) may be disposed between the lower insulating layer 22 and the hard bias layer 23. The bias underlying layer is composed of, for example, Cr, W, or Ti.

Each of the insulating layers 22 and 24 is composed of an insulating material, such as $Al_2O_3$ or $SiO_2$. The insulating layers 22 and 24 insulate the upper and lower surfaces of the hard bias layer 23 so that a current flowing in the multilayered film A perpendicular to the interfaces between the individual layers is prevented from shunting to both sides of the multilayered film A in the track width direction. The hard bias layer 23 is composed of, for example, a cobalt-platinum (Co—Pt) alloy, a cobalt-chromium-platinum (Co—Cr—Pt) alloy, or the like.

An upper shield layer 26 composed of Ni—Fe or the like is disposed over the multilayered film A and the upper insulating layer 24. The multilayered film A and the upper shield layer 26 may be disposed in contact with each other, or a nonmagnetic conductive material may be disposed between the multilayered film A and the upper shield layer 26.

In the embodiment shown in FIG. 1, the lower shield layer 21 and the upper shield layer 26 serve as electrode layers for the multilayered film A, so that a current flows in a direction perpendicular to the film surfaces of the individual layers of the multilayered film A (in a direction parallel to the Z direction in the figure).

The free magnetic layer 6 is magnetized in a direction parallel to the track width direction (X direction in the figure) under an influence of a bias magnetic field from the hard bias layer 23. On the other hand, each of the first pinned magnetic sublayer 4a and the second pinned magnetic sublayer 4c constituting the pinned magnetic layer 4 is magnetized in a direction parallel to the height direction (Y direction in the figure). Since the pinned magnetic layer 4 has a synthetic ferrimagnetic structure, the first pinned magnetic sublayer 4a and the second pinned magnetic sublayer 4c are magnetized antiparallel to each other. While the magnetization of the pinned magnetic layer 4 is pinned (does not vary in response to an external magnetic field), the magnetization of the free magnetic layer 6 varies in response to an external magnetic field.

When the magnetization of the free magnetic layer 6 varies in response to an external magnetic field and when the magnetization directions of the second pinned magnetic sublayer 4c and the free magnetic layer 6 are antiparallel to each other, a tunnel current does not easily flow through the insulating barrier layer 5 disposed between the second pinned magnetic sublayer 4c and the free magnetic layer 6, and then the resistance is a maximum. On the other hand, when the magnetization directions of the second pinned magnetic sublayer 4c and the free magnetic layer 6 are parallel to each other, the tunnel current flows most easily, and then the resistance is a minimum.

By use of the principle described above, a change in electrical resistance caused by a change in the magnetization of the free magnetic layer 6 under an influence of an external magnetic field is captured as a change in voltage to detect a leakage magnetic field from a magnetic recording medium.

Features of the tunneling magnetic sensing element according to the present embodiment will be described below.

In the present embodiment, the underlying layer 1, which is a bottom layer of the multilayered film A and disposed on and in contact with the lower shield layer 21, is composed of an amorphous magnetic material.

In the multilayered film A, as shown in FIG. 1, the protective layer 7, which is nonmagnetic, is disposed as a top layer. Between the underlying layer 1 and the protective layer 7, furthermore, at least the pinned magnetic layer 4, the insulating barrier layer (nonmagnetic material layer) 5, and the free magnetic layer 6 are disposed in the film thickness direction. The insulating barrier layer 5 is located between the pinned magnetic layer 4 and the free magnetic layer 6.

Referring to FIG. 1, the width of the lower shied layer 21 in the track width direction is T1, and the width of the upper shied layer 26 in the track width direction is T2. Concretely, the widths T1, T2 are about 10 to 200 μm.

On the other hand, the width of the multilayered film A in the track width direction is T3 at its broadest bottom portion.

The width T3 is considerably smaller than the widths T1, T2. The width T3 is about 0.05 to 0.5 μm. The track width Tw is about 0.03 to 0.3 μm.

In the present embodiment, as described above, since the underlying layer 1 is composed of a magnetic material, the upper surface of the underlying layer can be taken as a lower shield layer-side reference position for obtaining a gap length (GL) between the upper and lower shields, as shown in FIG. 1, resulting in a narrower gap than before. Narrowing the gap results in decreasing PW50 (half-amplitude pulse width) as will be described below.

Figure 13:
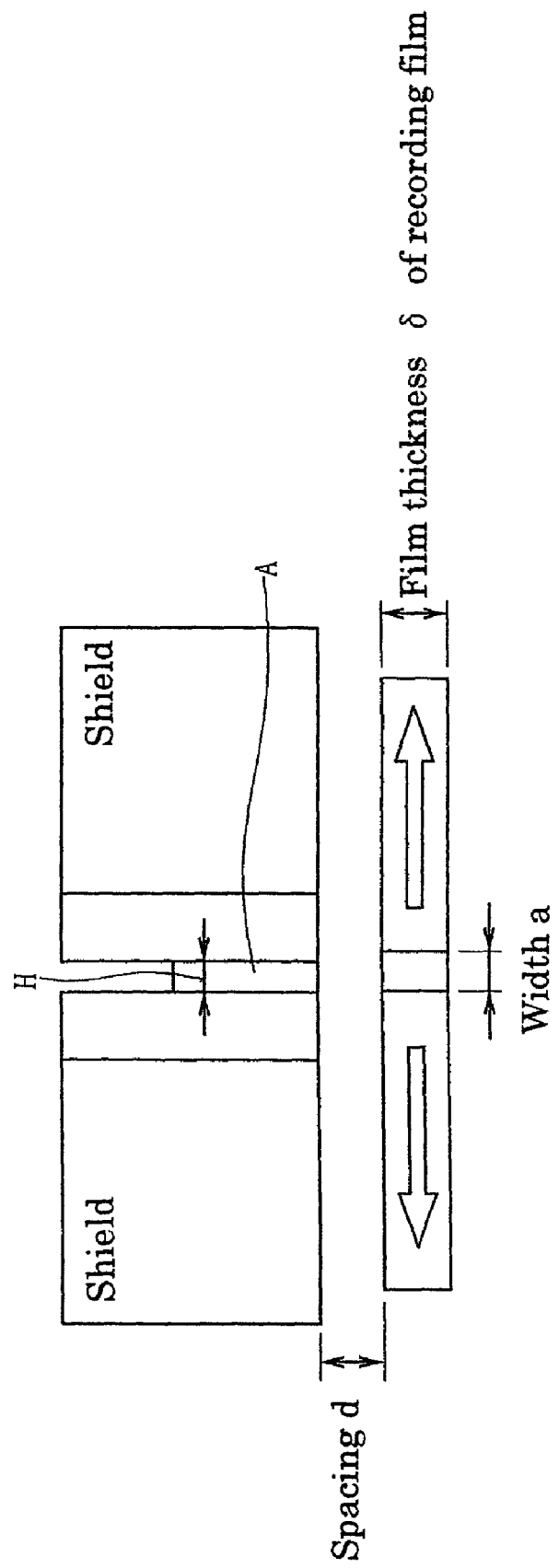
FIG. 13 is a schematic diagram showing a relationship between a magnetic sensing element and a magnetic recording medium for calculating a relationship between PW50 and a gap length between upper and lower shield layers (=a film thickness H of a multilayered film).

FIG. 13 is a schematic diagram showing a relationship between the magnetic sensing element of the present embodiment and a magnetic recording element.

In FIG. 13, the film thickness of the multilayered film A of the magnetic sensing element is H, the spacing between the magnetic sensing element and the recording medium is d, the magnetization transition width of the magnetic recording medium is a, and the film thickness of the recording layer is δ, wherein PW50 can be calculated from the following formula 1:

$$PW_{50}=2[(d+a+\delta)(d+a)+H^2/4]^{1/2}.$$

As seen from the formula 1, PW50 decreases with decreasing the film thickness H of the multilayered film A. The film thickness H of the multilayered film A can be translated into the gap length (GL) between the upper and lower shield layers. In the present embodiment, since the upper surface of the underlying layer 1 is taken as a lower shield layer-side reference position for obtaining the gap length between the upper and lower shields, the gap length decreases by the film thickness of the underlying layer 1, resulting in decreasing PW50.

Although longitudinal magnetic recording is adopted as a recording method for the recording medium of FIG. 13, PW50 decreases with decreasing the film thickness H of the multilayered film A also in the case of perpendicular magnetic recording.

In addition, the underlying layer 1 is amorphous, as described above. Therefore, not only the underlying layer 1 serves as a buffer layer which inhibits the crystalline orientation of the lower shield layer 21 from affecting the individual layers overlying the underlying layer 1, but the underlying layer 1 itself does not adversely affect the crystalline orientation of the individual layers overlying the underlying layer 1. Furthermore, the surface of the underlying layer 1 has good planarizability.

In the present embodiment, accordingly, reproducing characteristics such as rate of change in resistance (Δ R/R) can be maintained at almost the same level as before.

In the present embodiment, as has been described hereinabove, the reproducing resolution such as PW50 (half-amplitude pulse width) can be improved more than before while maintaining reproducing characteristics such as rate of change in resistance (Δ R/R) at almost the same level as before, thereby effectively increasing the recording density.

In the present embodiment, the underlying layer 1 is preferably composed of Co—X, Co—Fe—X (wherein X is one or more elements selected from the group consisting of B, Nb, Al, Si, Ti, V, Mn, Cu, Zr, Ta, and Hf), or Ni—Fe—Y (wherein Y is one or more elements selected from the group consisting of B, Nb, Al, Si, Ti, V, Mn, Cu, Zr, Ta, and Hf). More preferably, the underlying layer 1 is composed of a magnetic material whose composition formula is $\{Co_aFe_{100-a}\}_{100-b}X_b$ (wherein the atomic ratio "a" is from 25 to 100, and the concentration "b" of the element X is from 10 to 50 at %). Further preferably, the concentration "b" is from 10 to 40 at %. Further preferably, the element X is B.

The elements X and Y are added to facilitate transformation into an amorphous state. If the concentration of the element X or Y is low, the transformation into an amorphous state will be insufficient, but excessively high concentration will result in losing the magnetism. Accordingly, its concentration range should be decided in such a manner that the underlying layer is amorphous and magnetic. As described above, the concentration "b" of the element X is preferably from 10 to 50 at %, more preferably, from 10 to 40 at %. On the other hand, the element Y preferably has a concentration "c" in the range of 2 to 20 at %.

From the experiment described hereinbelow, it is seen that by using Co—Fe—B for the underlying layer 1, the rate of change in resistance (Δ R/R) can be maintained at almost the same level as before, and in addition, Co—Fe—B has such a low coercive force Hc (concretely, 1 to 2 Oe) as soft magnetic properties that the underlying layer 1 can properly serve as a shield layer. Thus, PW50 and SN ratio can be improved effectively.

The underlying layer 1 composed of an amorphous magnetic material has a higher milling rate than, for example, Ta has that has been used as an underlying layer in the prior art. In the conventional case where Ta is used as an underlying layer, since Ta has a lower milling rate than a magnetic layer and so on has, the underlying layer tends to project forward (toward a recording medium) from other layers through a milling process of a recording medium-facing surface (Air Bearing Surface, hereinafter referred to as "ABS") of the tunneling magnetic sensing element (pretreatment for formation of a protective layer on the ABS). If the underlying layer projects forward, a distance (spacing) between the recording medium and the tunneling magnetic sensing element when the thin-film magnetic head is floating over the magnetic medium has to be increased in order to prevent the underlying layer from hitting against the surface of the recording medium. In the present embodiment, however, the milling rate of the underlying layer 1 can be brought close to those of other layers by composing the underlying layer 1 of an amorphous magnetic material, thereby solving the conventional problem with projection of the underlying layer 1.

Also in the present embodiment, the underlying layer 1 preferably has a film thickness of 10 to 100 Å. More preferably, the underlying layer 1 has a film thickness of 10 to 50 Å. From the experiment described hereinbelow, it is seen that by setting the film thickness of the underlying layer 1 in the range of 10 to 100 Å, more preferably, in the range of 10 to 50 Å, PW50 and SN ratio can be improved more than in conventional configurations in which the underlying layer 1 is composed of Ta, and in addition, the rate of change in resistance (Δ R/R) can be maintained at almost the same level as before.

In the present embodiment, the lower shield layer 21 is preferably composed of a magnetic material having better soft magnetic properties than the underlying layer 1 has. This improves the shielding effect. As such a magnetic material having good soft magnetic properties, there may be adopted Ni—Fe, but if the underlying layer 1 is composed of Ni—Fe, the underlying layer 1 tends to crystallize, thereby decreasing the rate of change in resistance (Δ R/R) considerably as compared with the prior art. If the lower shield layer 21 is composed of Co—Fe—B like the underlying layer 1, on the other hand, the shielding effect will decrease, thereby deteriorating PW50 and SN ratio as compared with the case where the lower shield layer 21 is composed of Ni—Fe.

When the underlying layer 1 is composed of Co—Fe—B and the lower shield layer 21 is composed of Ni—Fe, accordingly, it becomes more effective to improve PW50 (half-amplitude pulse width) and SN ratio more than before while maintaining reproducing characteristics such as rate of change in resistance (Δ R/R) at almost the same level as before.

The magnetic sensing element shown in FIG. 1 is a tunneling magnetic sensing element. Accordingly, the multilayered film A includes the insulating barrier layer 5. In the present embodiment, the insulating barrier layer 5 is preferably composed of aluminum oxide (Al—O) or magnesium oxide (Mg—O).

In the case where the insulating barrier layer 5 is composed of Mg—O, the second pinned magnetic sublayer 4c/the insulating barrier layer 5/the enhancement layer 6a preferably have a body-centered cubic (bcc) structure in order to achieve a high rate of change in resistance (Δ R/R), wherein equivalent crystal planes represented as {100} planes are preferentially oriented along a plane parallel to the film surface (X—Y plane in the figure). As used herein, the term "crystal planes represented as {100} planes" refers to crystal lattice planes expressed by Miller index, wherein the above equivalent crystal planes represented as {100} planes include (100) plane, (−100) plane, (010) plane, (0-10) plane, (001) plane, and (00-1) plane. In order to control the crystalline orientation as above, the underlying layer 1 has to be prevented from affecting the crystal orientation of the individual layers to be formed thereon. Particularly in tunneling magnetic sensing elements, it is required that the interface between the insulating barrier layer 5 and the second pinned magnetic sublayer 4c and the interface between the insulating barrier layer 5 and the enhancement layer 6a have good planarizability so as to improve the rate of change in resistance (Δ R/R).

When an amorphous magnetic material, particularly Co—Fe—B, is used for the underlying layer 1, as in the present embodiment, since the underlying layer 1 itself does not affect the crystalline orientation of the individual layers to be formed thereon and its surface has good planarizability, the rate of change in resistance (Δ R/R) can be inhibited from decreasing as compared with the prior art.

Also with Ru used for the seed layer 2, the crystalline orientation of the individual layers to be formed thereon can be properly controlled to stably obtain a high rate of change in resistance (Δ R/R).

Unlike the multilayered film A according to the embodiment shown in FIG. 1, a multilayered film may be formed by depositing an underlying layer 1, a free magnetic layer 6, an insulating barrier layer 5, a pinned magnetic layer 4, an antiferromagnetic layer 3, and a protective layer 7 in that order from the bottom. Also in this case, the same effect as in the embodiment shown in FIG. 1 can be obtained by composing the underlying layer 1 of an amorphous magnetic material.

Although the tunneling magnetic sensing element according to the embodiment shown in FIG. 1 is of a single type, the present embodiment is also applicable to a dual type element formed by depositing, more specifically, an underlying layer 1, a seed layer 2, a lower antiferromagnetic layer, a lower pinned magnetic layer, a lower insulating barrier layer, a free magnetic layer, an upper insulating barrier layer, an upper pinned magnetic layer, an upper antiferromagnetic layer, and a protective layer 7 in that order from the bottom.

Moreover, although the magnetic sensing element according to the present embodiment is of a tunneling type, the present embodiment is also applicable to a CPP-GMR element in which a portion corresponding to the insulating barrier layer 5 is composed of a nonmagnetic conductive material such as Cu.

However, the present embodiment is preferably applied to a tunneling magnetic sensing element whose multilayered film A is formed by depositing an underlying layer 1, a seed layer 2, an antiferromagnetic layer 3, a pinned magnetic layer 4, an insulating barrier layer 5, a free magnetic layer 6, and a protective layer 7 in that order from the bottom. With this configuration, as proved in the experiment described hereinbelow, PW50 (half-amplitude pulse width) and SN ratio can be effectively improved more than before while maintaining reproducing characteristics such as rate of change in resistance (Δ R/R) at almost the same level as before.

Figure 2:
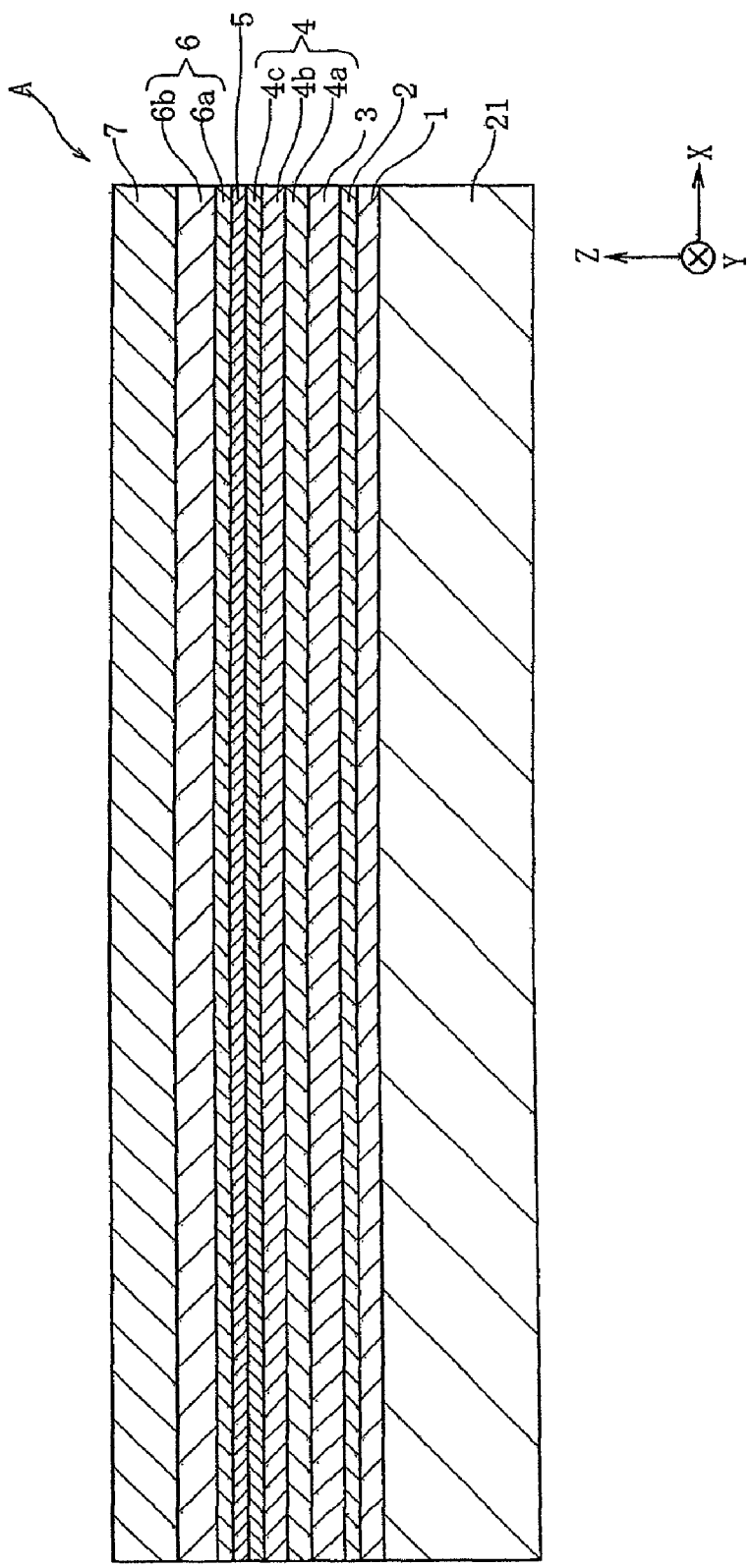
FIG. 2 is a diagram showing a step of a method for manufacturing a tunneling magnetic sensing element according to one embodiment of the present invention (cross-sectional view of a tunneling magnetic sensing element in a manufacturing process, taken along a plane parallel to a surface facing a recoding medium)
Figure 3:
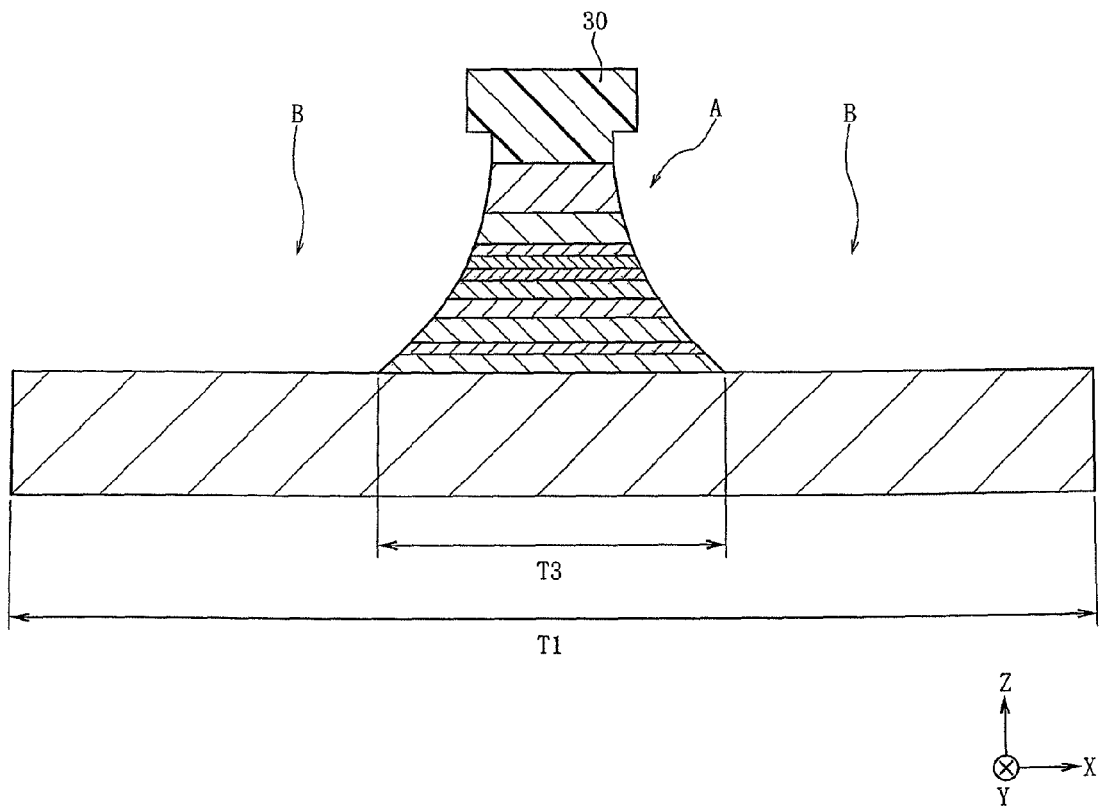
FIG. 3 is a diagram showing a step subsequent to the step shown in FIG. 2 (cross-sectional view of a tunneling magnetic sensing element in a manufacturing process, taken along a plane parallel to a surface facing a recoding medium)
Figure 4:
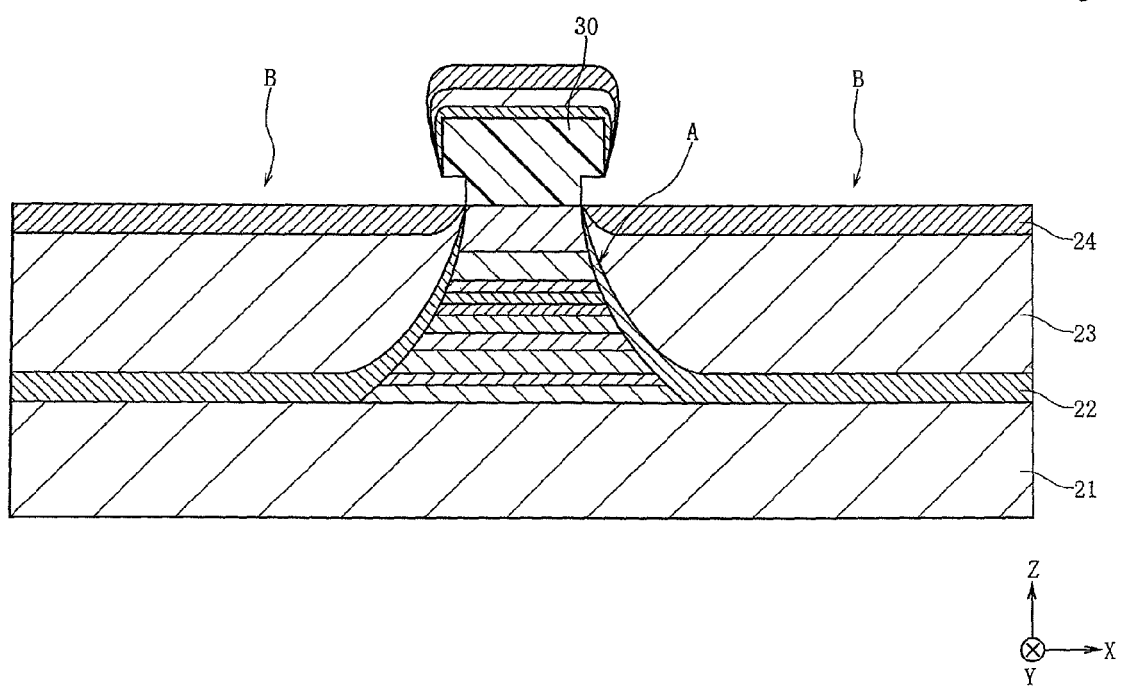
FIG. 4 is a diagram showing a step subsequent to the step shown in FIG. 3 (cross-sectional view of a tunneling magnetic sensing element in a manufacturing process, taken along a plane parallel to a surface facing a recoding medium)

A method for manufacturing the tunneling magnetic sensing element according to this embodiment will be described below. FIGS. 2 to 4 are each a partial cross-sectional view of the tunneling magnetic sensing element in a manufacturing process, taken at the same position as the tunneling magnetoresistive element shown in FIG. 1.

In the step shown in FIG. 2, after a lower shield layer 21 is composed of a magnetic material, an underlying layer 1, a seed layer 2, an antiferromagnetic layer 3, a first pinned magnetic sublayer 4a, a nonmagnetic intermediate sublayer 4b, a second pinned magnetic sublayer 4c, an insulating barrier layer 5, an enhancement layer 6a, a soft magnetic layer 6b, and a protective layer 7 are continuously formed on the lower shield layer 21 in that order from the bottom. The three-layered structure including the first pinned magnetic sublayer 4a/the nonmagnetic intermediate sublayer 4b/the second pinned magnetic sublayer 4c forms a pinned magnetic layer 4 with a synthetic ferrimagnetic structure. The two-layered structure including the enhancement layer 6a and the soft magnetic layer 6b forms a free magnetic layer 6.

The lower shield layer 21 is preferably composed of a magnetic material having better soft magnetic properties than the underlying layer 1 has. More specifically, the lower shield layer 21 is preferably composed of Ni—Fe.

In the present embodiment, the underlying layer 1 composed of an amorphous magnetic material is disposed on and in contact with the lower shield layer 21. In the present embodiment, the underlying layer 1 is preferably composed of Co—X, Co—Fe—X (wherein X is one or more elements selected from the group consisting of B, Nb, Al, Si, Ti, V, Mn, Cu, Zr, Ta, and Hf), or Ni—Fe—Y (wherein Y is one or more elements selected from the group consisting of B, Nb, Al, Si, Ti, V, Mn, Cu, Zr, Ta, and Hf). More preferably, the underlying layer 1 is composed of a magnetic material whose composition formula is $\{Co_a Fe_{100-a}\}_{100-b} X_b$ (wherein the atomic ratio "a" is from 25 to 100, and the concentration "b" of the element X is from 10 to 50 at %). Further preferably, the concentration "b" is from 10 to 40 at %. Further preferably, the element X is B.

Also preferably, the underlying layer 1 has a film thickness of 10 to 100 Å. More preferably, the underlying layer 1 has a film thickness of 10 to 50 Å.

The insulating barrier layer 5 may be composed of Al—O in such a manner that an Al layer is first deposited on the second pinned magnetic sublayer 4c, such as by sputtering, with a given film thickness and then oxidized. Alternatively, the insulating barrier layer 5 may be composed of Mg—O in such a manner that a Mg—O layer is directly deposited on the second pinned magnetic sublayer 4c by using a target composed of Mg—O having a predetermined composition ratio.

In the step shown in FIG. 3, subsequently, a resist layer 30 for lift-off processing is formed on the multilayered film A composed of the layers from the underlying layer 1 to the protective layer 7, and then both side portions B, B of the multilayered film A in the track width direction (X direction in the figure), which are not covered with the resist layer 30 for lift-off processing, are removed by etching or the like.

Thus, the maximum width T3 of the multilayered film A in the track width direction (X direction in the figure) becomes smaller than the width T1 of the lower shield layer 21 in the track width direction (X direction in the figure).

Subsequently, a lower insulating layer 22, a hard bias layer 23, and an upper insulating layer 24 are deposited in that order from the bottom, at each side of the multilayered film A in the track width direction (X direction in the figure) and on the lower shield layer 21 (refer to FIG. 4).

Subsequently, the resist layer 30 for lift-off processing is removed, and then an upper shield layer 26 is formed over the multilayered film A and the upper insulating layer 24.

The method for manufacturing the tunneling magnetic sensing element described above includes heat treatment after formation of the multilayered film A. Typically, the heat treatment is carried out for producing an exchange coupling magnetic field (Hex) between the antiferromagnetic layer 3 and the first pinned magnetic sublayer 4a.

In the present embodiment, at the step shown in FIG. 2, after the formation of the lower shield layer 21, the individual layers of the multilayered film A to be formed on the lower shield layer 21 are deposited continuously in the same vacuum. Since such continuous deposition prevents the surfaces of the individual layers from being exposed to an outside air, the crystalline orientation of the individual layers can be properly controlled.

In the present embodiment, the underlying layer 1 is composed of an amorphous magnetic material. Therefore, not only the underlying layer 1 serves as a buffer layer between the lower shield layer 21 and the individual layers overlying the underlying layer 1, but the underlying layer 1 itself does not adversely affect the crystalline orientation of the individual layers overlying the underlying layer 1. This also improves planarizability of the surface of the underlying layer 1.

With the underlying layer 1 being composed of a magnetic material, moreover, the upper surface of the underlying layer 1 can be taken as a lower shield layer 21-side reference position for obtaining a gap length (GL) between the upper and lower shield layers, resulting in a narrower gap than before.

According to the manufacturing method, as described above, a magnetic sensing element, in which PW50 (half-amplitude pulse width) and SN ratio can be improved more than before while avoiding a decrease in reproducing characteristics such as rate of change in resistance ($\Delta$ R/R), can be manufactured easily and appropriately.

In addition to use as a magnetic head in a hard disk drive, the magnetic sensing element according to the present embodiment can also be used as a MRAM (magnetoresistive random access memory) or a magnetic sensor.

While the present invention has been particularly shown and described with reference to embodiments thereof, it will be understood by those skilled in the art that various changes in form and detail may be made therein without departing from the spirit, scope and teaching of the invention.

Examples 1 to 5

A tunneling magnetic sensing element shown in FIG. 1 was fabricated.

A multilayered film A was formed by depositing underlying layer 1; $\{Co_{0.75}Fe_{0.25}\}_{80at\%}B_{20at\%}(X)$/seed layer 2; Ru(30)/antiferromagnetic layer 3; $Ir_{26at\%}Mn_{74at\%}(70)$/pinned magnetic layer 4 [first pinned magnetic sublayer 4a; $Co_{70at\%}Fe_{30at\%}(21)$/nonmagnetic intermediate sublayer 4b; Ru(8.5)/second pinned magnetic sublayer 4c; $\{Co_{50}Fe_{50}\}_{80at\%}B_{20at\%}(19)$]/insulating barrier layer 5/free magnetic layer 6 [enhancement layer 6a; $Co_{20at\%}Fe_{80at\%}(10)$/soft magnetic layer 6b; $Ni_{88at\%}Fe_{12at\%}(50)$]/protective layer 7; [Ru(20)/Ta(270)] in that order from the bottom.

In the multilayered film A, each of the values in parentheses indicates an average film thickness in terms of Å.

In the experiment, the insulating barrier layer 5 was composed of Al—O in such a manner that an Al layer was first deposited on the second pinned magnetic sublayer 4c with an average film thickness of 4.3 Å and then oxidized.

After the multilayered film A was formed, annealing treatment was carried out at 270° C. for 3 hours 40 minutes in a magnetic field of 10 kOe.

In the experiment, individual samples were measured for film properties such as rate of change in resistance ($\Delta$ R/R) and electric properties such as PW50 with the average film thickness of the underlying layer 1 being set at 10 Å, 20 Å, 30 Å, 50 Å, and 100 Å.

Conventional Example 1

A sample having the same film composition as the above multilayered film A was prepared except that the underlying layer 1 was replaced with a layer of Ta(30).

After subjected to the same annealing treatment in a magnetic field as the samples of Examples, the sample of Conventional Example 1 was measured for film properties such as rate of change in resistance ($\Delta$ R/R) and electric properties such as PW50.

Conventional Example 2

A sample having the same film composition as the above multilayered film A was prepared except that the underlying layer 1 was not provided.

After subjected to the same annealing treatment in a magnetic field as the samples of Examples, the sample of Conventional Example 2 was measured for film properties such as rate of change in resistance ($\Delta$ R/R).

The experimental results are shown in Table 1 below.

TABLE 1

| | | | Film properties | | | | Electric properties | | |
|---|---|---|---|---|---|---|---|---|---|
| Sample | Underlying layer (Å) | TuMR Total thickness (Å) | RA ($\Omega$ $\mu m^2$) | $\Delta$ R/R (%) | Hex* (Oe) | Hex (Oe) | SN ratio (dB) | PW50 (nm) | Res. (%) |
| Con. Ex. 1 | Ta(30) | 565 | 3.54 | 31.0 | 3800 | 2900 | 14.02 | 70.22 | 66.02 |
| Con. Ex. 2 | — | 535 | 3.50 | 30.8 | 2980 | 2650 | — | — | — |

TABLE 1-continued

| Sample | Underlying layer (Å) | TuMR Total thickness (Å) | Film properties | | | | Electric properties | | |
|---|---|---|---|---|---|---|---|---|---|
| | | | RA ($\Omega$ $\mu m^2$) | $\Delta$ R/R (%) | Hex* (Oe) | Hex (Oe) | SN ratio (dB) | PW50 (nm) | Res. (%) |
| Ex. 1 | $(Co_{75}Fe_{25})_{80}B_{20}(10)$ | 545 | 3.48 | 30.2 | 3400 | 2720 | — | — | — |
| Ex. 2 | $(Co_{75}Fe_{25})_{80}B_{20}(20)$ | 555 | 3.42 | 30.8 | 3820 | 2940 | 14.28 | 68.25 | 68.22 |
| Ex. 3 | $(Co_{75}Fe_{25})_{80}B_{20}(30)$ | 565 | 3.44 | 30.8 | 3800 | 2900 | 14.30 | 68.21 | 67.85 |
| Ex. 4 | $(Co_{75}Fe_{25})_{80}B_{20}(50)$ | 585 | 3.42 | 30.5 | 3800 | 2880 | 14.22 | 68.32 | 67.92 |
| Ex. 5 | $(Co_{75}Fe_{25})_{80}B_{20}(100)$ | 535 | 3.42 | 30.2 | 3820 | 2920 | 14.02 | 69.36 | 66.5 |

Hex shown in Table 1 indicates a magnitude of the exchange coupling magnetic field generated between the first pinned magnetic sublayer 4a and the antiferromagnetic layer 3. On the other hand, Hex* indicates a magnitude of the whole magnetic field used for pinning the magnetization of the pinned magnetic layer, which includes the above exchange coupling magnetic field and a coupling magnetic field due to RKKY interaction generated between magnetic layers of a synthetic ferrimagnetic structure.

With respect to Hex and Hex*, a larger value is preferred in order to increase the force for pinning the magnetization of the pinned magnetic layer. Also with respect to SN ratio and Res. (resolution), a larger value is preferred. With respect to PW50, on the other hand, a smaller value is preferred.

Figure 5:
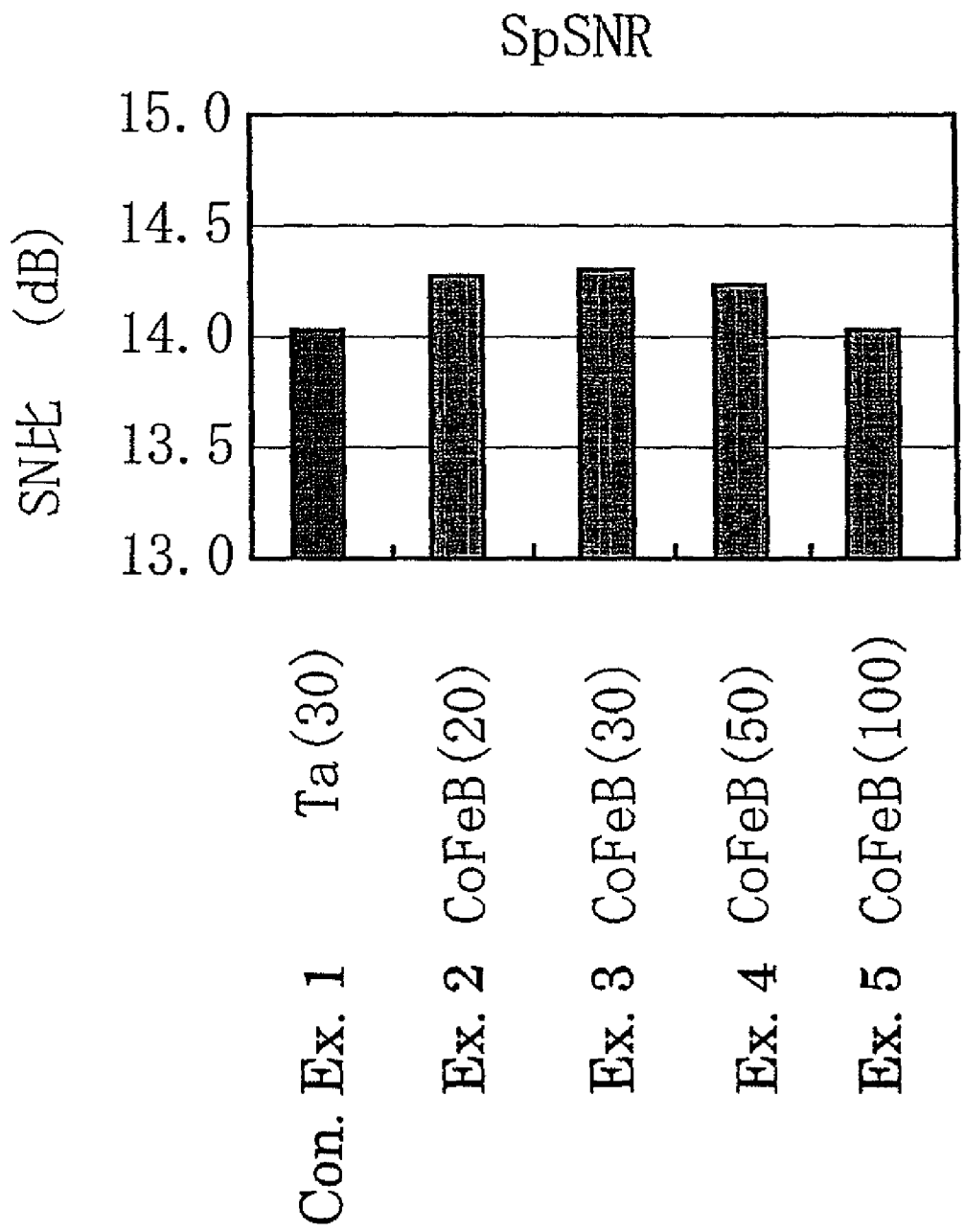
FIG. 5 is a bar graph showing SN ratio for individual samples of Conventional Example 1 in which an underlying layer was composed of Ta and Examples 2 to 5 in which underlying layers were composed of Co—Fe—B with different film thicknesses.
Figure 6:
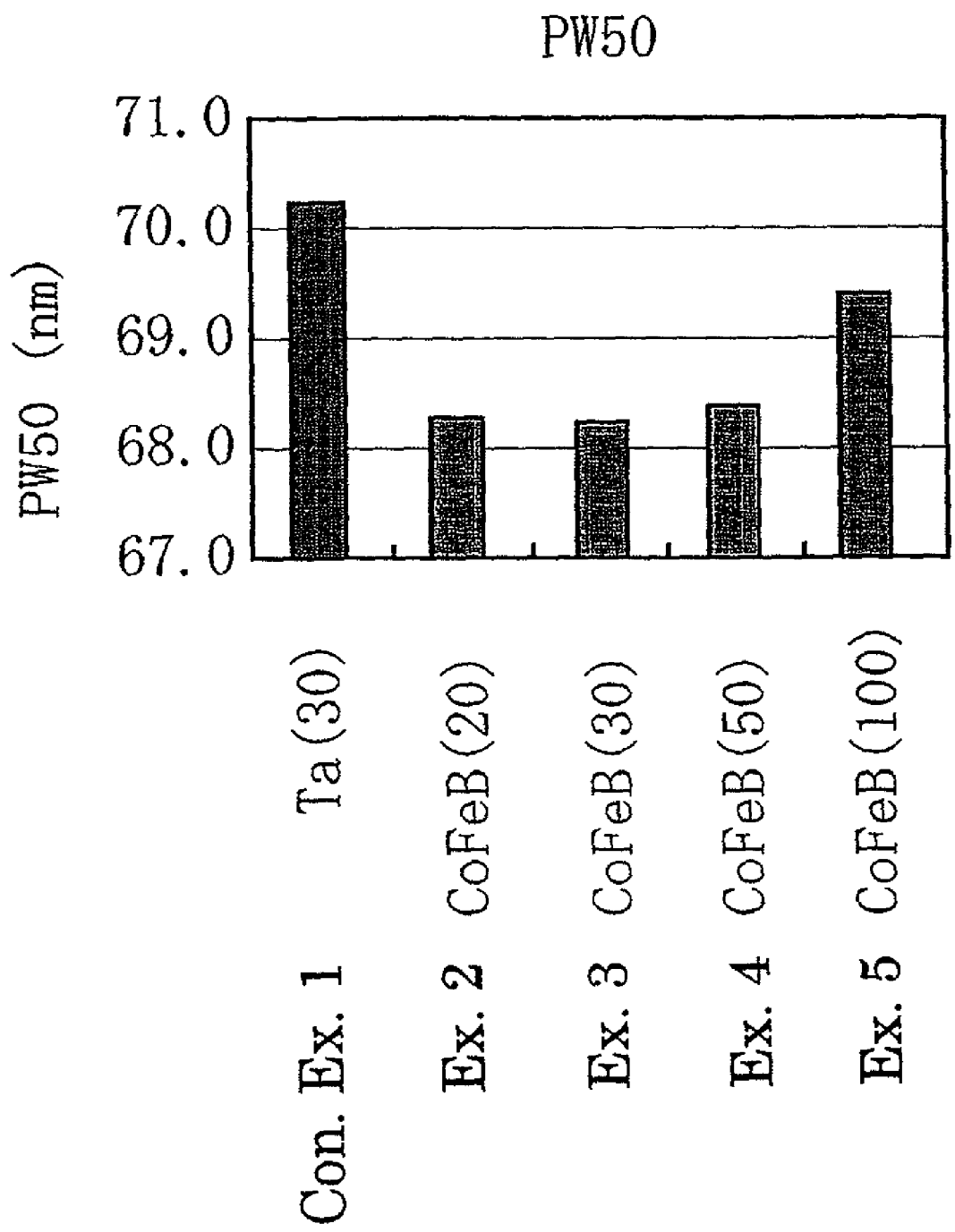
FIG. 6 is a bar graph showing PW50 for individual samples of Conventional Example 1 in which an underlying layer was composed of Ta and Examples 2 to 5 in which underlying layers were composed of Co—Fe—B with different film thicknesses.
Figure 7:
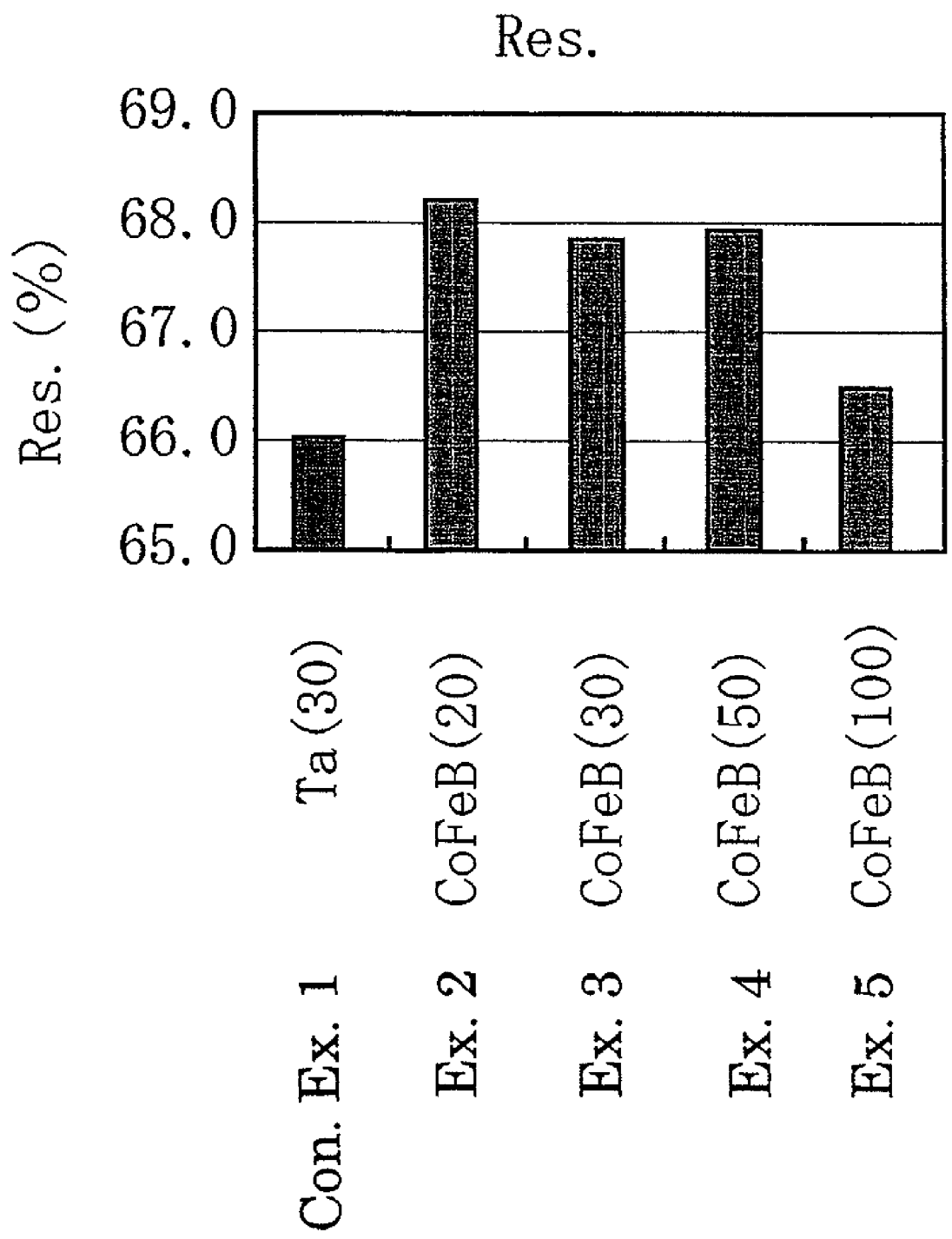
FIG. 7 is a bar graph showing Res. (resolution) for individual samples of Conventional Example 1 in which an underlying layer was composed of Ta and Examples 2 to 5 in which underlying layers were composed of Co—Fe—B with different film thicknesses.

FIG. 5 is a bar graph showing SN ratio for Conventional Example 1 and Examples 2 to 5. FIG. 6 is a bar graph showing PW50 for Conventional Example 1 and Examples 2 to 5. FIG. 7 is a bar graph showing Res. (resolution) for Conventional Example 1 and Examples 2 to 5.

As shown in FIG. 5, SN ratio was larger in Examples than in Conventional Example 1. As shown in FIG. 6, PW50 was smaller in Examples than in Conventional Example 1. As shown in FIG. 7, Res. (resolution) was larger in Examples than in Conventional Example 1.

In Examples in which the film thickness of the underlying layer 1 was set equal to or less than 50 Å, as shown in FIGS. 5 to 7, all PW50, SN ratio, and Res. (resolution) were sufficiently improved as compared with those in Conventional Example 1. That is, superior results were obtained as compared with the prior art.

Figure 8:
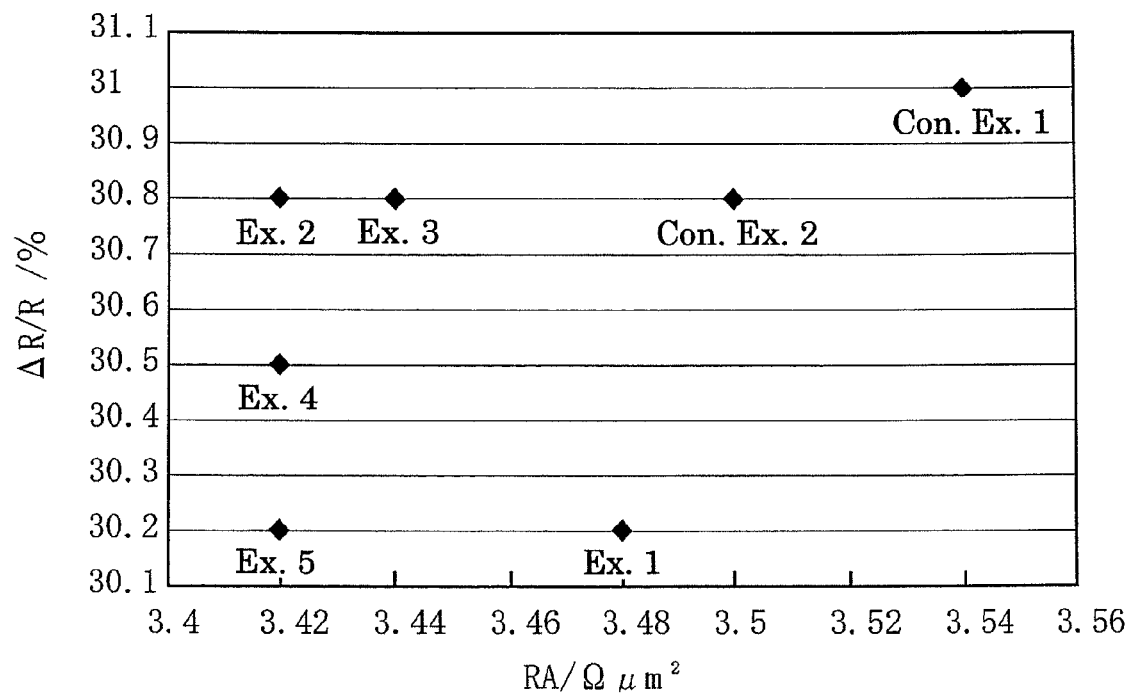
FIG. 8 is a graph showing a relationship between RA (element resistance R×element area A) and rate of change in resistance (Δ R/R) for individual samples of Conventional Example 1 in which an underlying layer was composed of Ta, Conventional Example 2 in which an underlying layer was not provided, and Examples 1 to 5 in which underlying layers were composed of Co—Fe—B with different film thicknesses.

FIG. 8 is a graph showing a relationship between RA and rate of change in resistance ($\Delta$ R/R) for individual samples of Conventional Examples 1 and 2 and Examples 1 to 5.

As shown in FIG. 8, RA was smaller in Examples 1 to 5 than in Conventional Examples 1 and 2.

With respect to the rate of change in resistance ($\Delta$ R/R), Examples 2 and 3 had almost the same value as Comparative Example 2.

As compared with Comparative Example 1 in which the underlying layer was composed of Ta, the rate of change in resistance ($\Delta$ R/R) was smaller in any sample of Examples 1 to 5 than in the sample of Conventional Example 1. However, RA values of the samples of Examples 1 to 5 were different from that of the sample of Conventional Example 1.

In the next experiment, accordingly, the rate of change in resistance ($\Delta$ R/R) was studied with samples being controlled to have almost the same RA value.

Examples 6 and 7

A tunneling magnetic sensing element shown in FIG. 1 was fabricated.

A multilayered film A was formed by depositing underlying layer 1; $\{Cu_{0.75}Fe_{0.25}\}_{80at\%}B_{20at\%}(X)$/seed layer 2; Ru(30)/antiferromagnetic layer 3; $Ir_{26at\%}Mn_{74at\%}(80)$/pinned magnetic layer 4 [first pinned magnetic sublayer 4a; $Co_{70at\%}Fe_{30at\%}(21)$/nonmagnetic intermediate sublayer 4b; Ru(9)/second pinned magnetic sublayer 4c; $\{Co_{75}Fe_{25}\}_{80at\%}B_{20at\%}(19)/Co_{70at\%}Fe_{30at\%}(6)$]/insulating barrier layer 5/free magnetic layer 6 [enhancement layer 6a; $Co_{20at\%}Fe_{80at\%}(10)$/soft magnetic layer 6b; $Ni_{88at\%}Fe_{12at\%}(50)$]/protective layer 7; [Ru(20)/Ta(270)] in that order from the bottom.

In the multilayered film A, each of the values in parentheses indicates an average film thickness in terms of Å.

In the experiment, the insulating barrier layer 5 was composed of Al—O in such a manner that an Al layer was first deposited on the second pinned magnetic sublayer 4c with an average film thickness of 4.3 Å and then oxidized. At this time, the oxidation time was controlled to have a RA value close to 3.4 ($\Omega\mu m^2$).

After the multilayered film A was formed, annealing treatment was carried out at 270° C. for 3 hours 40 minutes in a magnetic field of 10 kOe.

In the experiment, Examples 6 and 7 were measured for rate of change in resistance ($\Delta$ R/R), RA, and so on with the average film thickness of the underlying layer 1 being set at 20 Å and 30 Å.

Conventional Example 3

A sample having the same film composition as the above multilayered film A was prepared except that the underlying layer 1 was replaced with a layer of Ta(20).

In the sample of Conventional Example 3, the insulating barrier layer composed of Al—O was also obtained such that at the time of oxidation of the Al layer, the oxidation time was controlled to have a RA value close to 3.4 ($\Omega\mu m^2$).

After subjected to the same annealing treatment in a magnetic field as the samples of Examples 6 and 7, the sample of Conventional Example 3 was measured for rate of change in resistance ($\Delta$ R/R), RA, and so on.

The experimental results are shown in Table 2 below.

TABLE 2

| Sample | Underlying layer (Å) | RA ($\Omega$ $\mu m^2$) | $\Delta$ R/R (%) | Hin (Oe) | Hcf (Oe) |
|---|---|---|---|---|---|
| Con. Ex. 3 | Ta(20) | 3.25 | 31.2 | 11.5 | 1.9 |
| Ex. 6 | $(Co_{75}Fe_{25})_{80}B_{20}(30)$ | 3.14 | 31.0 | 10.8 | 1.8 |
| Ex. 7 | $(Co_{75}Fe_{25})_{80}B_{20}(20)$ | 3.06 | 30.3 | 11.3 | 1.7 |

Figure 9:
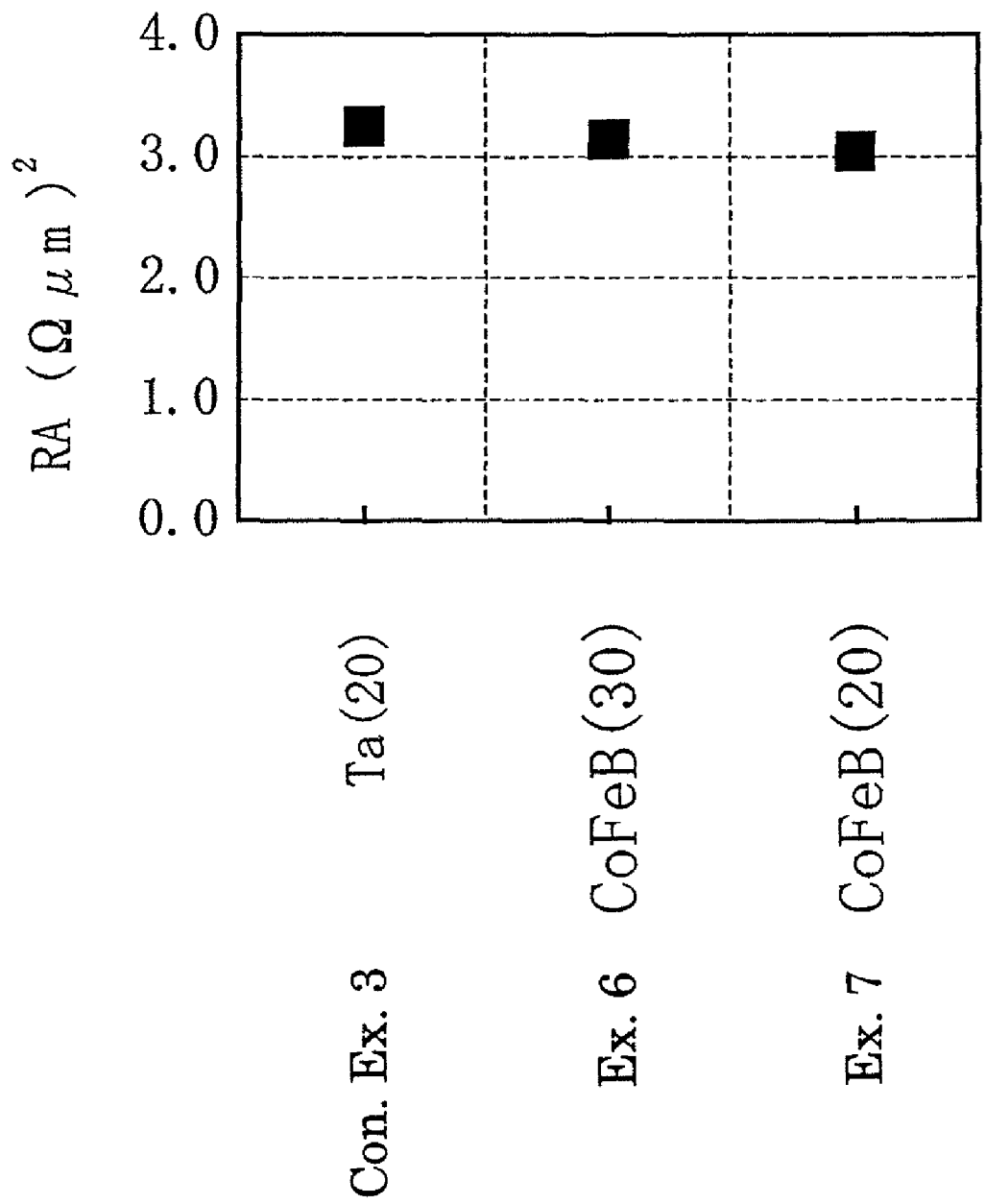
FIG. 9 is a graph showing RA for individual samples of Conventional Example 3 in which an underlying layer was composed of Ta and Examples 6 and 7 in which underlying layers were composed of Co—Fe—B with different film thicknesses.
Figure 10:
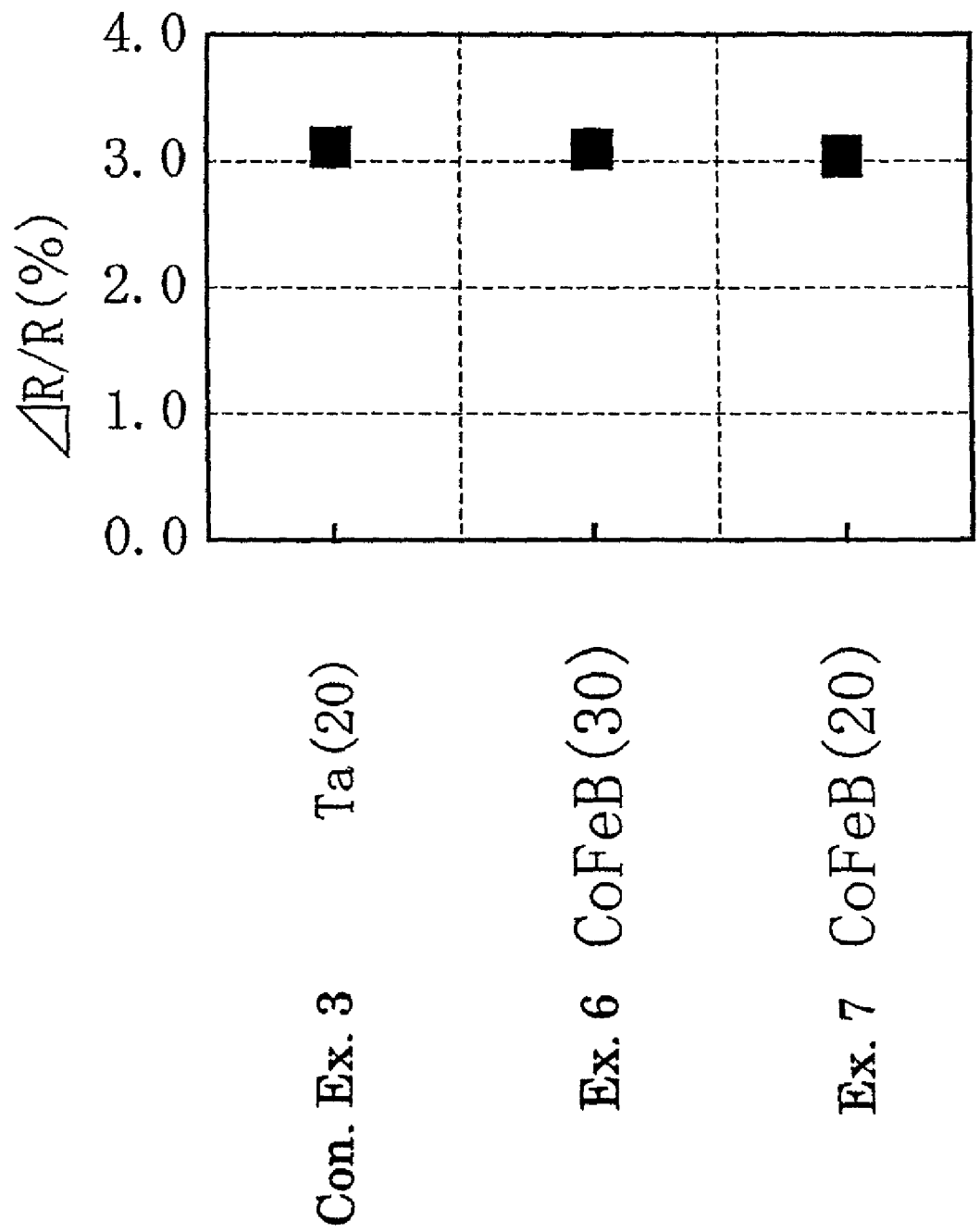
FIG. 10 is a graph showing rate of change in resistance (Δ R/R) for individual samples of Conventional Example 3 in which an underlying layer was composed of Ta and Examples 6 and 7 in which underlying layers were composed of Co—Fe—B with different film thicknesses.

FIG. 9 is a bar graph showing RA for individual samples of Conventional Example 3 and Examples 6 and 7. FIG. 10 is a bar graph showing the rate of change in resistance ($\Delta$ R/R) for individual samples of Conventional Example 3 and Examples 6 and 7.

It is seen that when the individual samples of Conventional Example 3 and Examples 6 and 7 were controlled to have almost the same RA, as shown in FIG. 9, the individual samples of Conventional Example 3 and Examples 6 and 7 had almost the same rate of change in resistance (Δ R/R), as shown in FIG. 10.

This means that even when Co—Fe—B is used for the underlying layer 1, the resulting rate of change in resistance (Δ R/R) and RA are almost equal to those of the conventional ones using Ta.

Table 2 also shows the experimental results about the interlayer coupling magnetic field Hin acting between the free magnetic layer and the pinned magnetic layer and the coercive force Hc of the free magnetic layer, but these values did not differ greatly between Conventional Example 3 and Examples 6 and 7.

Example 8

A tunneling magnetic sensing element shown in FIG. 1 was fabricated.

A multilayered film A was formed by depositing underlying layer 1; $\{Co_{0.5}Fe_{0.5}\}_{70at\%}B_{30at\%}(30)$/seed layer 2; Ru(25)/antiferromagnetic layer 3; $Ir_{26at\%}Mn_{74at\%}(70)$/pinned magnetic layer 4 [first pinned magnetic sublayer 4a; $Co_{70at\%}Fe_{30at\%}(22)$/nonmagnetic intermediate sublayer 4b; Ru(9.1)/second pinned magnetic sublayer 4c; $\{Co_{50}Fe_{50}\}_{70at\%}B_{30at\%}(18)/Co_{50at\%}Fe_{50at\%}(8)$]/insulating barrier layer 5; Mg—O(X)/free magnetic layer 6 [enhancement layer 6a; $Co_{50at\%}Fe_{50at\%}(10)$/soft magnetic layer 6b; $Ni_{86at\%}Fe_{14at\%}(60)$]/protective layer 7; [Ru(20)/Ta(180)] in that order from the bottom.

In the multilayered film A, each of the values in parentheses indicates an average film thickness in terms of Å.

In the experiment, the insulating barrier layer 5 was deposited using a target composed of Mg—O, wherein a plurality of samples were prepared by varying the film thickness of the insulating barrier layer 5.

After the multilayered film A was formed, annealing treatment was carried out at 270° C. for 3 hours 40 minutes in a magnetic field of 10 kOe.

In the experiment, the individual samples (Example 8) with different film thicknesses for the insulating barrier layer 5 were measured for RA and rate of change in resistance (Δ R/R).

Conventional Example 4

A plurality of samples with different film thicknesses for the insulating barrier layer 5 were prepared. Each sample had the same layered structure as Example 8 above except that the underlying layer was replaced with a layer of Ta(20).

After subjected to the same annealing treatment in a magnetic field as the samples of Example 8, the samples of Conventional Example 4 were measured for RA and rate of change in resistance (Δ R/R).

Example 9

A tunneling magnetic sensing element shown in FIG. 1 was fabricated.

A multilayered film A was formed by depositing underlying layer 1; $\{Co_{0.5}Fe_{0.5}\}_{70at\%}B_{30at\%}(X)$/seed layer 2; Ru(25)/antiferromagnetic layer 3; $Ir_{26at\%}Mn_{74at\%}(70)$/pinned magnetic layer 4 [first pinned magnetic sublayer 4a; $Co_{70at\%}Fe_{30at\%}(22)$/nonmagnetic intermediate sublayer 4b; Ru(9.1)/second pinned magnetic sublayer 4c; $\{Co_{50}Fe_{50}\}_{70at\%}B_{30at\%}(18)/Co_{50at\%}Fe_{50at\%}(8)$]/insulating barrier layer 5; Mg—O(11.2)/free magnetic layer 6 [enhancement layer 6a; $Co_{50at\%}Fe_{50at\%}(10)$/soft magnetic layer 6b; $Ni_{86at\%}Fe_{14at\%}(60)$]/protective layer 7; [Ru(20)/Ta(180)] in that order from the bottom.

In the multilayered film A, each of the values in parentheses indicates an average film thickness in terms of Å.

In the experiment, the insulating barrier layer 5 was deposited using a target composed of Mg—O. A plurality of samples (Example 9) were prepared with the film thickness of the underlying layer 1 being set at 10 Å, 20 Å, 40 Å, and 50 Å.

After the multilayered film A was formed, annealing treatment was carried out at 270° C. for 3 hours 40 minutes in a magnetic field of 10 kOe.

In the experiment, the individual samples of Example 9 were measured for RA and rate of change in resistance (Δ R/R).

Figure 11:
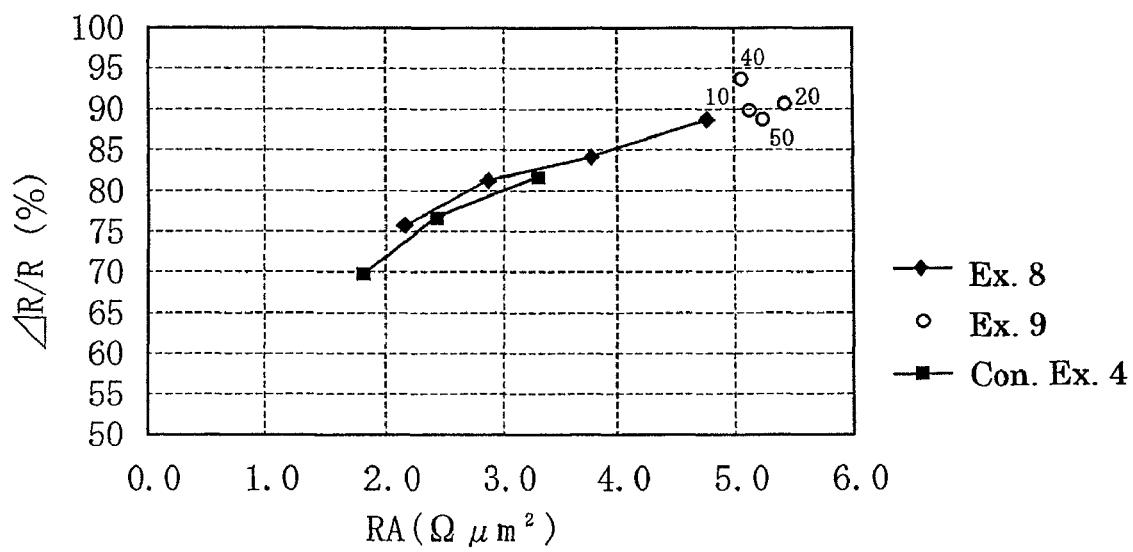
FIG. 11 is a graph showing a relationship between RA and rate of change in resistance (Δ R/R) for individual samples of Conventional Example 4 in which insulating barrier layers were provided with different film thicknesses while adopting Ta for an underlying layer, Example 8 in which insulating barrier layers were provided with different film thicknesses while adopting Co—Fe—B for an underlying layer, and Example 9 in which underlying layers were composed of Co—Fe—B with different film thicknesses.

FIG. 11 shows a relationship between RA and rate of change in resistance (Δ R/R) for the individual samples of Examples 8 and 9 and Conventional Example 4.

As shown in FIG. 11, Example 8 and Conventional Example 4 behaved similarly with respect to the relationship between RA and rate of change in resistance (Δ R/R). Moreover, Example 9 did not differ greatly in rate of change in resistance (Δ R/R) even though the film thickness of the underlying layer 1 was varied in the range of 10 to 50 Å.

Figure 12:
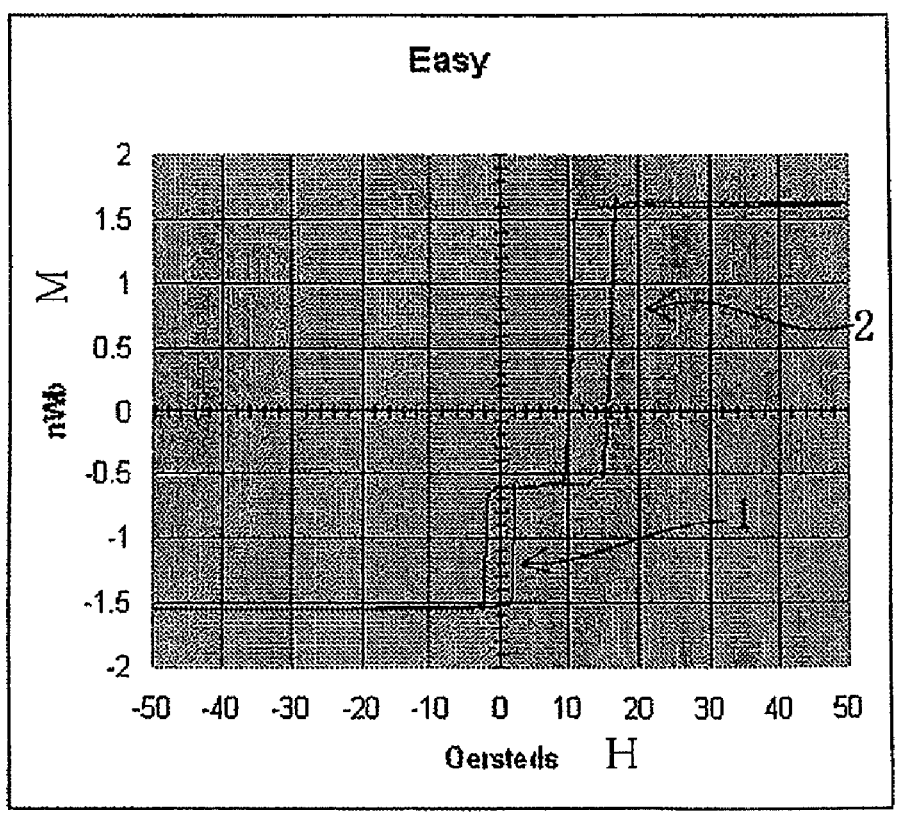
FIG. 12 is a graph showing a M-H curve (magnetization-magnetic field curve; hysteresis loop) along an easy axis of an underlying layer composed of Co—Fe—B.

FIG. 12 shows a M-H curve (magnetization-magnetic field curve; hysteresis loop) along an easy axis of the underlying layer composed of Co—Fe—B. As shown by the hysteresis loop indicated by an arrow 1 in FIG. 12, Co—Fe—B had a coercive force Hc as low as 1 to 2 Oe. Thus, it is seen that Co—Fe—B is excellent in soft magnetic properties. Accordingly, it is seen that when Co—Fe—B is used for the underlying layer 1, the underlying layer 1 can properly serve as a shield layer.

Since the experiment in FIG. 12 was carried out with respect to the structure of the tunneling magnetic sensing element, FIG. 12 also shows a M-H curve of the free magnetic layer (indicated by an arrow 2).

The invention claimed is:

1. A magnetic sensing element comprising a multilayered film with a plurality of layers stacked between opposing lower and upper shield layers that are spaced apart from each other in a film thickness direction,
   wherein a maximum width of said multilayered film in a track width direction is smaller than a width of either of said lower and upper shield layers in said track width direction, and at both sides of said multilayered film in said track width direction, a bias layer and an insulating layer constitute a laminated structure filling a space between said lower and upper shield layers,
   wherein a bottom layer of said multilayered film is an underlying layer disposed on and in contact with said lower shield layer, a top layer of said multilayered film is a protective layer, said multilayered film further includes at least a pinned magnetic layer, a free magnetic layer, and a nonmagnetic material layer deposited between said underlying layer and said protective layer in said film thickness direction, and said nonmagnetic material layer is disposed between said pinned magnetic layer and said free magnetic layer,
   wherein said underlying layer is composed of an amorphous magnetic material.

2. The magnetic sensing element according to claim 1, wherein said underlying layer is composed of Co—X, Co—Fe—X (wherein X is one or more elements selected from the group consisting of B, Nb, Al, Si, Ti, V, Mn, Cu, Zr, Ta, and Hf), or Ni—Fe—Y (wherein Y is one or more elements selected from the group consisting of B, Nb, Al, Si, Ti, V, Mn, Cu, Zr, Ta, and HO.

3. The magnetic sensing element according to claim 2, wherein said underlying layer is composed of a magnetic material whose composition formula is $\{Co_aFe_{100-a}\}_{100-b}X_b$ (wherein an atomic ratio "a" is from 25 to 100, and a concentration "b" of an element X is from 10 to 50 at %).

4. The magnetic sensing element according to claim 3, wherein said concentration "b" is from 10 to 40 at %.

5. The magnetic sensing element according to claim 1, wherein said underlying layer has an average film thickness of 10 to 100 Å.

6. The magnetic sensing element according to claim 5, wherein said underlying layer has an average film thickness of 10 to 50 Å.

7. The magnetic sensing element according to claim 1, wherein said lower shield layer is composed of a magnetic material having better soft magnetic properties than said underlying layer has.

8. The magnetic sensing element according to claim 7, wherein said lower shield layer is composed of Ni—Fe.

9. The magnetic sensing element according to claim 1, wherein said nonmagnetic material layer is an insulating barrier layer.

10. The magnetic sensing element according to claim 9, wherein said insulating barrier layer is composed of Al—O or Mg—O.

11. The magnetic sensing element according to claim 1, wherein said multilayered film is formed by depositing said underlying layer, a seed layer, an antiferromagnetic layer, said pinned magnetic layer, said nonmagnetic material layer, said free magnetic layer, and said protective layer in the named order.

12. A method for manufacturing a magnetic sensing element comprising:
(a) forming a lower shield layer;
(b) forming a multilayered film on said lower shield layer, said multilayered film having a plurality of layers deposited continuously in a same vacuum, a bottom layer of said multilayered film being an underlying layer composed of an amorphous magnetic material and disposed on and in contact with said lower shield layer, a top layer of said multilayered film being a protective layer, said multilayered film further including at least a pinned magnetic layer, a free magnetic layer, and a nonmagnetic material layer deposited between said underlying layer and said protective layer in a film thickness direction, said nonmagnetic material layer being disposed between said pinned magnetic layer and said free magnetic layer;
(c) removing both side portions of said multilayered film in a track width direction so that a maximum width of said multilayered film in said track width direction is smaller than a width of said lower shield layer in said track width direction;
(d) forming a laminated structure including a bias layer and an insulating layer to fill a space created by removing said both side portions of said multilayered film; and
(e) forming an upper shield layer over said multilayered film and said laminated structure at both sides of said multilayered film, said upper shield layer having a larger width than said multilayered film in said track width direction.

13. The method according to claim 12, wherein said underlying layer is composed of Co—X, Co—Fe—X (wherein X is one or more elements selected from the group consisting of B, Nb, Al, Si, Ti, V, Mn, Cu, Zr, Ta, and Hf), or Ni—Fe—Y (wherein Y is one or more elements selected from the group consisting of B, Nb, Al, Si, Ti, V, Mn, Cu, Zr, Ta, and Hf).

14. The method according to claim 13, wherein said underlying layer is composed of a magnetic material whose composition formula is $\{Co_aFe_{100-a}\}_{100-b}X_b$ (wherein an atomic ratio "a" is from 25 to 100, and a concentration "b" of an element X is from 10 to 50 at %).

15. The method according to claim 14, wherein said concentration "b" is from 10 to 40 at %.

16. The method according to claim 12, wherein said underlying layer has an average film thickness of 10 to 100 Å.

17. The method according to claim 16, wherein said underlying layer has an average film thickness of 10 to 50 Å.

18. The method according to claim 12, wherein said lower shield layer is composed of a magnetic material having better soft magnetic properties than said underlying layer has.

19. The method according to claim 18, wherein said lower shield layer is composed of Ni—Fe.

20. The method according to claim 12, wherein said nonmagnetic material layer is an insulating barrier layer composed of Al—O or Mg—O.

21. The method according to claim 12, wherein said multilayered film is formed by depositing said underlying layer, a seed layer, an antiferromagnetic layer, said pinned magnetic layer, said nonmagnetic material layer, said free magnetic layer, and said protective layer in the named order.

* * * * *